(12) United States Patent
Park

(10) Patent No.: US 7,001,843 B2
(45) Date of Patent: Feb. 21, 2006

(54) METHODS OF FORMING METAL LINES IN SEMICONDUCTOR DEVICES

(75) Inventor: Tae-Hee Park, Bucheon (KR)

(73) Assignee: DongbuAnam Semiconductor, Inc., Seoul (KR)

( * ) Notice: Subject to any disclaimer, the term of this patent is extended or adjusted under 35 U.S.C. 154(b) by 41 days.

(21) Appl. No.: 10/749,650

(22) Filed: Dec. 30, 2003

(65) Prior Publication Data

US 2004/0157435 A1   Aug. 12, 2004

(30) Foreign Application Priority Data

Jan. 30, 2003   (KR) ............... 10-2003-0006407

(51) Int. Cl.
*H01L 21/44* (2006.01)

(52) U.S. Cl. ............... 438/669; 438/72; 438/622; 438/628; 438/636; 438/654; 438/751

(58) Field of Classification Search ............. 438/69, 438/72, 618, 642, 622–625, 636–637, 652–654, 438/669, 688, 672–675, 737–738, 749–751; 427/534–535; 216/41, 67–71, 79
See application file for complete search history.

(56) References Cited

U.S. PATENT DOCUMENTS

| | | | |
|---|---|---|---|
| 5,736,192 A * | 4/1998 | Okamoto | 216/17 |
| 5,843,847 A * | 12/1998 | Pu et al. | 438/723 |
| 5,886,410 A | 3/1999 | Chiang et al. | 257/759 |
| 6,013,582 A * | 1/2000 | Ionov et al. | 438/738 |
| 6,043,163 A * | 3/2000 | Tsai et al. | 438/706 |
| 6,177,353 B1 * | 1/2001 | Gutsche et al. | 438/704 |
| 6,238,582 B1 | 5/2001 | Williams et al. | 216/22 |
| 6,268,287 B1 * | 7/2001 | Young et al. | 438/671 |
| 6,323,132 B1 * | 11/2001 | Hwang et al. | 438/706 |
| 6,399,512 B1 * | 6/2002 | Blosse et al. | 438/723 |
| 6,537,918 B1 * | 3/2003 | Ionov et al. | 438/710 |
| 6,559,001 B1 * | 5/2003 | Athavale et al. | 438/243 |
| 6,635,566 B1 * | 10/2003 | Blosse et al. | 438/638 |
| 6,790,784 B1 * | 9/2004 | Catabay et al. | 438/726 |
| 2001/0005637 A1 * | 6/2001 | Kim et al. | 438/710 |
| 2001/0051439 A1 * | 12/2001 | Khan et al. | 438/710 |
| 2002/0072016 A1 * | 6/2002 | Chen et al. | 430/323 |
| 2002/0165105 A1 * | 11/2002 | Yates et al. | 510/175 |
| 2002/0183977 A1 * | 12/2002 | Sui et al. | 702/188 |
| 2004/0082182 A1 * | 4/2004 | Blosse et al. | 438/700 |
| 2005/0009323 A1 * | 1/2005 | Han | 438/636 |

* cited by examiner

*Primary Examiner*—Bradley Baumeister
*Assistant Examiner*—Granvill D. Lee, Jr.
(74) *Attorney, Agent, or Firm*—Hanley, Flight & Zimmerman, LLC

(57) ABSTRACT

Methods for forming metal lines in semiconductor devices are disclosed. One example method may include forming a lower adhesive layer on a semiconductor substrate; forming a metal layer including aluminum on the lower adhesive layer; forming an anti-reflection layer on the metal layer; forming a photomask on the anti-reflection layer; performing an initial etching, a main etching and an over-etching for the anti-reflection layer, the metal layer and the lower adhesive layer, respectively, in a region which is not protected by the photomask, using $C_3F_8$ as a main etching gas; and removing the photomask residual on the anti-reflection layer.

13 Claims, 2 Drawing Sheets

METHODS OF FORMING METAL LINES IN SEMICONDUCTOR DEVICES

TECHNICAL FIELD

The present disclosure relates to semiconductor devices and, more particularly, to methods of forming metal lines in semiconductor devices.

BACKGROUND

Metal lines used for electrical connection between elements in a semiconductor device are completed as an intended line pattern through a process including the steps of depositing aluminum mainly to form a metal layer, patterning a photoresist on the metal layer to form a photomask, and dry etching the metal layer in a region not protected by the photomask using an etching gas.

Currently, a process for dry etching the metal layer is performed using reactive gases of Cl series such as $Cl_2$ or $BCl_3$. However, in the case of the reactive gases of Cl series, a problem arises in that the metal line is corroded unless the photomask is removed immediately after the metal layer is etched. This is because the aluminum metal layer is changed into a compound in the form of $AlCl_x$ through a reaction with $Cl_x$ and the compound causes the corrosion by reacting with moisture in the air when the compound is exposed in the air.

Therefore, conventionally, the photomask is generally removed under a vacuum state immediately after the metal layer is etched, and vapor and oxygen plasma ashing process has been used at a high temperature of 250° C. in order to remove chlorine composition absorbed on an entire surface of a wafer when the photomask is removed.

However, the above-described process has a problem in that the removal of the photomask is easily not performed. In addition, due to a problem of manufacture equipments, there is a problem in that the corrosion of the metal line occurs in the case that a process wafer has to be drawn out to the air immediately after the metal layer is etched.

As a result, it is not easy to form the metal line having the intended line pattern, and line defects of the semiconductor device are induced, which are major causes of malfunction of the semiconductor device.

To overcome these problems, techniques for etching an interlayer insulation film, a hard mask, etc., using etching gases of non-Cl series such as $CF_4$, $CHF_3$, $C_3F_8$, $C_2H_6$, and $SF_6$, are disclosed in U.S. Pat. Nos. 6,238,582 and 5,886,410.

DETAILED DESCRIPTION

Figure 1A:
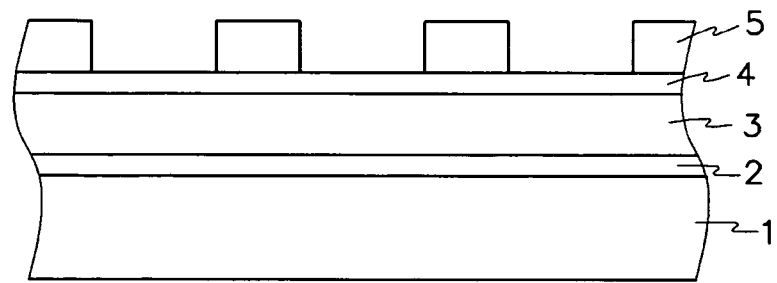
FIGS. 1A to 1E are views illustrating a metal line formation process of a semiconductor device according to one disclosed example.

First, as shown in FIG. 1A, a lower layer (not shown) formed by such as elements and lower lines is formed on a semiconductor substrate 1 and an interlayer insulation film (not shown) is formed on the lower layer for interlayer insulation between the lower layer and a metal line, which will be formed later. In addition, a lower adhesive layer 2, a metal layer 3, which is main material of the metal line, and an reflection layer 4 are formed in order on the interlayer insulation film.

The lower adhesive layer 2 and the anti-reflection layer 4 are films selectively deposited for enhancing an adhesive strength of the metal layer 3 to the semiconductor substrate 1 and preventing impurities from penetrating into the metal layer 3. The lower adhesive layer 2 and the anti-reflection layer 4 are made of Ti or TiN and are formed at a predetermined thickness by using a sputtering process or the like.

The metal layer 3 made of aluminum is formed at a thickness thicker than that of the lower adhesive layer 2, preferably, 4,000 to 6,000 Å, by using a sputtering process or the like.

Subsequently, after a photoresist is applied on the anti-reflection layer 4, an exposure and development process using an exposure mask (not shown) is performed for forming a predetermined pattern of photomask 5 to expose a portion to be etched.

Figure 1B:
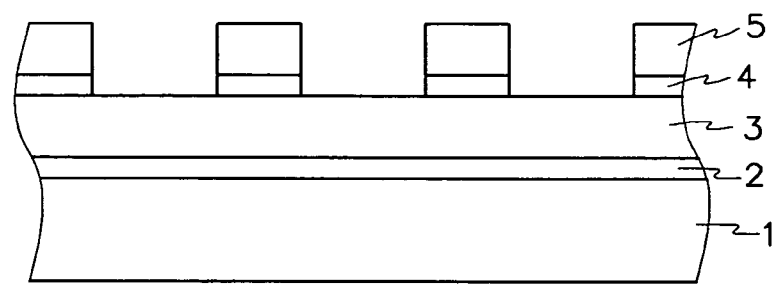

Next, as shown in FIG. 1B, an initial etching process for dry etching the anti-reflection layer 4, which is not protected by the photomask 5, using $C_3F_8$, $BCl_3$ and Ar as etching gases, is performed to expose a portion of a surface of the metal layer 3.

As conditions for performing the initial etching process, a pressure of 12 mT, a source power of 1,200 W and a bias power of 130 W are used. In addition, $C_3F_8$ of 1 to 200 sccm, $BCl_3$ of 1 to 100 sccm, and Ar of 1 to 100 sccm are used as process gases. In one example, $C_3F_8$ of 60 sccm, $BCl_3$ of 50 sccm, and Ar of 30 sccm are used as process gases. In this initial etching process, an etching rate of Ti or TiN is 3,000 to 4,000 Å/min.

Figure 1C:
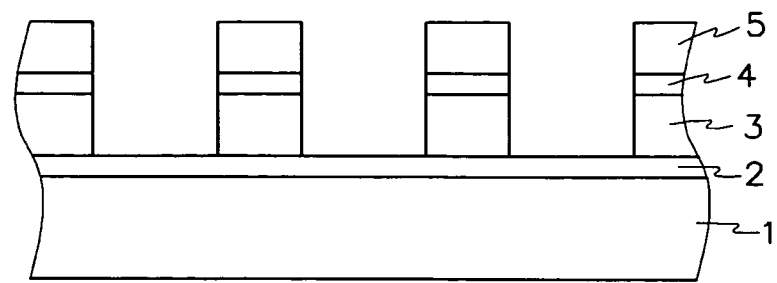

Subsequently, as shown in FIG. 1C, a main etching process using $C_3F_8$, $NF_3$, and $N_2$ as etching gases is performed. As a result of this process, the metal layer 3 in a region which is not protected by the photomask 5 is dry etched to expose a surface of the lower adhesive layer 2.

As conditions for performing the main etching process, a pressure of 12 mT, a source power of 1,000 W and a bias power of 100 W are used. In addition, $C_3F_8$ of 1 to 200 sccm, $NF_3$ of 1 to 100 sccm, and $N_2$ of 1 to 100 sccm are used as process gases. In one example, $C_3F_8$ of 90 sccm, $NF_3$ of 50 sccm, and $N_2$ of 10 sccm are used as process gases. In this main etching process, an etching rate of aluminum is 6,000 to 7,000 Å/min.

Figure 1D:
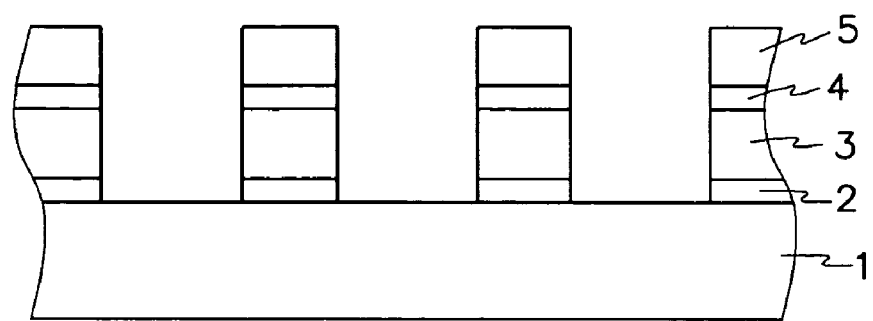

In addition, as shown in FIG. 1D, an over-etching process using $C_3F_8$, $NF_3$, and $N_2$ as etching gases is performed. As a result of this process, the lower adhesive layer 2 in a region which is not protected by the photomask 5 is dry etched to remain the lower adhesive layer 2 only below the residual metal layer 3.

As conditions for performing the over-etching process, a pressure of 12 mT, a source power of 1,000 W and a bias power of 80 W are used. In addition, $C_3F_8$ of 1 to 200 sccm, $NF_3$ of 1 to 100 sccm, and $N_2$ of 1 to 100 sccm are used as process gases. Preferably, $C_3F_8$ of 80 sccm, $NF_3$ of 50 sccm, and $N_2$ of 5 sccm are used as process gases. In this over-etching process, an etching rate of Ti or TiN is 4,000 to 5,000 Å/min.

As disclosed herein, when the main etching process and the over-etching process are performed, a $C_3F_8$ gas of carbon and fluorine series, which does not directly react with aluminum as material of the metal layer 3, may be used as a main etching gas and a small quantity of $N_2$ gas is added for polymer generation.

As the $C_3F_8$ gas and $NF_3$ gas do not directly react with aluminum, there is little fear of corrosion of the metal layer 3. In addition, as the $C_3F_8$ gas has an excellent characteristic in the etching rate respect over $CF_4$ gas used commonly, the former has a more advantage for metal line formation over the latter.

Figure 1E:
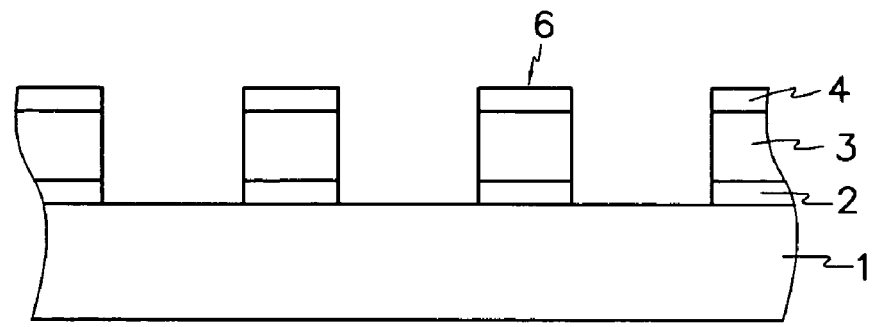

Finally, the photomask 5 residual on the anti-reflection layer 4 is removed to complete a metal line 6 as shown in FIG. 1E. In one example, as the $C_3F_8$ gas and $NF_3$ gas are used as main etching gases when the metal layer and the lower adhesive layer are dry etched, quality of the metal line 6 is not deteriorated even when the photomask 5 is not instantly removed after etching of the metal layer 3. Therefore, the problem of corrosion of the metal line can be overcome, and hence, malfunction of the semiconductor device can be prevented and semiconductor device yield can be greatly improved. In addition, because the photomask need not be instantly removed after the metal layer is etched, restriction on process conditions can be reduced.

As disclosed herein, example semiconductor device manufacturing methods are provided to forming a metal line in a semiconductor device that is capable of preventing line defects of a semiconductor device by preventing the metal line from being corroded, and eliminating a need of immediate removal of a photomask after etching of a metal layer. According to one example, a method includes forming a lower adhesive layer on a semiconductor substrate; forming a metal layer including aluminum on the lower adhesive layer; forming an anti-reflection layer on the metal layer; forming a photomask on the anti-reflection layer; performing an initial etching, a main etching and an over-etching for the anti-reflection layer, the metal layer and the lower adhesive layer, respectively, in a region which is not protected by the photomask, using C3F8 as a main etching gas; and removing the photomask residual on the anti-reflection layer.

In the foregoing example method, the metal layer may be formed be depositing aluminum at a thickness of 4,000 to 6000 Å. In another example, when the anti-reflection layer, the metal layer and the lower adhesive layer are etched, the etching is performed through the step of initial etching for etching the anti-reflection layer under the conditions of $C_3F_8$ of 1 to 200 sccm, $BCl_3$ of 1 to 100 sccm, and Ar of 1 to 100 sccm, the main etching for etching the metal layer under the conditions of $C_3F_8$ of 1 to 200 sccm, $NF_3$ of 1 to 100 sccm, and $N_2$ of 1 to 100 sccm, and the over-etching for etching the lower adhesive layer under the conditions of $C_3F_8$ of 1 to 200 sccm, $NF_3$ of 1 to 100 sccm, and $N_2$ of 1 to 100 sccm.

Although certain example methods are disclosed herein, the scope of coverage of this patent is not limited thereto. On the contrary, this patent covers every apparatus, method and article of manufacture fairly falling within the scope of the appended claims either literally or under the doctrine of equivalents.

What is claimed is:

1. A method for forming a metal line in a semiconductor device, the method comprising:

forming a lower adhesive layer on a semiconductor substrate;

forming a metal layer including aluminum on the lower adhesive layer;

forming an anti-reflection layer on the metal layer;

forming a photomask on the anti-reflection layer;

performing an initial etching, a main etching and an over-etching for the anti-reflection layer, the metal layer and the lower adhesive layer, respectively, in a region which is not protected by the photomask, using $C_3F_8$ as a main etching gas, wherein the main etching of the metal layer is performed using a reactive gas including $C_3F_8$, $NF_3$ and $N_2$; and removing the photomask residual on the anti-reflection layer.

2. A method as defined by claim 1, wherein, when the main etching is performed, $C_3F_8$ is injected at 1 to 200 sccm, $NF_3$ is injected at 1 to 100 sccm, and $N_2$ injected at 1 to 100 sccm.

3. A method as defined by claim 1, wherein, when the main etching is performed, $C_3F_8$ is injected at 90 sccm, $NF_3$ is injected at 50 sccm, and $N_2$ is injected at 10 sccm.

4. A method as defined by claim 3, wherein, as process conditions for the main etching, a pressure of 12 mT, a source power of 1,000 W and a bias power of 100 W are used.

5. A method as defined by claim 4, wherein the metal layer is deposited at a thickness of 4,000 to 6,000 Å.

6. A method as defined by claim 1, wherein the initial etching for etching the anti-reflection layer is performed using a reactive gas including $C_3F_8$, $BCl_3$ and Ar.

7. A method as defined by claim 6, wherein, when the initial etching is performed, $C_3F_8$ is injected at 1 to 200 sccm, $BCl_3$ is injected at 1 to 100 sccm, and Ar is injected at 1 to 100 sccm.

8. A method as defined by claim 6, wherein, when the initial etching is performed, $C_3F_8$ is injected at 60 sccm, $BCl_3$ is injected at 50 sccm, and Ar is injected at 30 sccm.

9. A method as defined by claim 8, wherein, as process conditions for the initial etching, a pressure of 12 mT, a source power of 1,200 W and a bias power of 130 W are used.

10. A method as defined by claim 1, wherein the over-etching for etching the lower adhesive layer is performed using a reactive gas including $C_3F_8$, $NF_3$ and $N_2$.

11. The method of claim 10, wherein, when the over-etching is performed, $C_3F_8$ is injected at 1 to 200 sccm, $NF_3$ is injected at 1 to 100 sccm, and $N_2$ is injected at 1 to 100 sccm.

12. A method as defined by claim 10, wherein, when the over-etching is performed, $C_3F_8$ is injected at 80 sccm, $NF_3$ is injected at 50 sccm, and $N_2$ is injected at 50 sccm.

13. A method as defined by claim 12, wherein, as process conditions for the over-etching, a pressure of 12 mT, a source power of 1,000 W and a bias power of 80 W are used.

* * * * *